US012568784B2

(12) United States Patent
Mikuriya et al.

(10) Patent No.: US 12,568,784 B2
(45) Date of Patent: Mar. 3, 2026

(54) METHOD OF POLISHING CARRIER PLATE, CARRIER PLATE, AND METHOD OF POLISHING SEMICONDUCTOR WAFER

(71) Applicant: SUMCO Corporation, Tokyo (JP)

(72) Inventors: Shunsuke Mikuriya, Tokyo (JP); Shinya Takubo, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 299 days.

(21) Appl. No.: 18/259,100

(22) PCT Filed: Nov. 19, 2021

(86) PCT No.: PCT/JP2021/042696
§ 371 (c)(1), (2) Date: Jun. 23, 2023

(87) PCT Pub. No.: WO2022/137934
PCT Pub. Date: Jun. 30, 2022

(65) Prior Publication Data
US 2024/0055262 A1 Feb. 15, 2024

(30) Foreign Application Priority Data
Dec. 24, 2020 (JP) ................................ 2020-214814

(51) Int. Cl.
*H01L 21/304* (2006.01)
*B24B 37/04* (2012.01)
(Continued)

(52) U.S. Cl.
CPC .......... *H10P 52/00* (2026.01); *H10P 72/0428* (2026.01); *H10P 72/7618* (2026.01); *B24B 37/042* (2013.01); *B24B 37/08* (2013.01)

(58) Field of Classification Search
None
See application file for complete search history.

(56) References Cited

U.S. PATENT DOCUMENTS 6,746,311 B1 * 6/2004 Kessel .................. B24D 11/00 51/293
7,494,519 B2 * 2/2009 Fletcher ............... B24B 37/042 451/36
(Continued)

FOREIGN PATENT DOCUMENTS

DE 112015000878 11/2016
JP 2002-254299 9/2002
(Continued)

OTHER PUBLICATIONS

Office Action issued in Corresponding KR Patent Application No. 10-2023-7020997, dated Jul. 10, 2024, along with an English translation thereof.

(Continued)

*Primary Examiner* — Stephanie P Duclair
(74) *Attorney, Agent, or Firm* — Greenblum & Bernstein, P.L.C.

(57) ABSTRACT

Provided is a method capable of efficiently polishing the front and back sides of a carrier plate unused after manufacture, which is used in a double-sided polishing process for semiconductor wafers. The method comprises: sandwiching a carrier plate unused after manufacture and to be polished between an upper surface plate and a lower surface plate in the double-sided polishing apparatus, and supplying a polishing liquid while relatively rotating the carrier plate to be polished, the upper surface plate, and the lower surface plate to polish both sides of the carrier plate to be polished, wherein a polishing pad including, on its surface, an abrasive grain-containing layer in which abrasive grains of 2 μm or more in grain size are embedded is used as a polishing pad in a double-sided polishing apparatus.

18 Claims, 2 Drawing Sheets

(51) Int. Cl.

| | |
|---|---|
| ***B24B 37/08*** | (2012.01) |
| ***H01L 21/67*** | (2006.01) |
| ***H01L 21/687*** | (2006.01) |
| ***H10P 52/00*** | (2026.01) |
| ***H10P 72/00*** | (2026.01) |
| ***H10P 72/76*** | (2026.01) |

(56) References Cited

U.S. PATENT DOCUMENTS

2017/0069502 A1* 3/2017 Sato ........................ B24B 37/08
2019/0047113 A1* 2/2019 Kitazume ............. B24B 37/044
2020/0164484 A1 5/2020 Meyer et al.

FOREIGN PATENT DOCUMENTS

| | | | |
|---|---|---|---|
| JP | 2006-26760 | | 2/2006 |
| JP | 200626760 A | † | 2/2006 |
| JP | 5648623 | | 1/2015 |
| JP | 2015-174168 | | 10/2015 |
| JP | 2015174168 A | † | 10/2015 |
| JP | 2016-198864 | | 12/2016 |
| JP | 2017-104958 | | 6/2017 |
| JP | 2020-529332 | | 10/2020 |
| KR | 10-2020-0037269 | | 4/2020 |
| WO | 2017/159213 | | 9/2017 |

OTHER PUBLICATIONS

Third Party Observations for Corresponding DE Patent Application No. 112021006666.8, dated Feb. 27, 2024, along with an English translation thereof.

International Search Report issued in International Patent Application No. PCT/JP2021/042696, dated Feb. 15, 2022, along with an English translation thereof.

International Preliminary Report on Patentability Issued in International Patent Application No. PCT/JP2021/042696, dated Jun. 13, 2023, along with an English translation thereof.

Office Action issued in Corresponding JP Patent Application No. 2020-214814, dated Aug. 22, 2023, along with an English translation thereof.

* cited by examiner
† cited by third party

MEASUREMENT LOCATION

O

E

METHOD OF POLISHING CARRIER PLATE, CARRIER PLATE, AND METHOD OF POLISHING SEMICONDUCTOR WAFER

TECHNICAL FIELD

The present disclosure relates to a method of polishing a carrier plate, a carrier plate, and a method of polishing a semiconductor wafer.

BACKGROUND

In the manufacture of semiconductor wafers such as silicon wafers used as substrates of semiconductor devices, a double-sided polishing process is performed in order to achieve higher flatness and surface roughness. The double-sided polishing process is a process in which a semiconductor wafer is sandwiched between a pair of an upper surface plate and a lower surface plate to which polishing pads are attached and a polishing liquid is supplied to simultaneously polish both sides of the semiconductor wafer. During this process, the semiconductor wafer is held in a wafer holding hole of a carrier plate.

As the carrier plate, carrier plates made of metal such as stainless steel or titanium (see, for example, PTL 1) and carrier plates made of resin (see, for example, PTL 2) are available. Carrier plates unused after manufacture, regardless of whether they are made of metal or resin, are thicker than a thickness within which semiconductor wafer polishing is possible or have low flatness. Hence, a treatment of polishing the front and back sides of the carrier plate before placing the carrier plate in a double-sided polishing apparatus and polishing the semiconductor wafer is performed.

For example, PTL 3 describes a method by which, before placing a carrier plate in a double-sided polishing apparatus and performing double-sided polishing treatment on a wafer, a double-sided polishing apparatus different from that used for double-sided polishing the wafer is used to subject the carrier plate to two-step double-sided polishing consisting of primary polishing using slurry containing abrasive grains and secondary polishing using an inorganic alkaline solution not containing abrasive grains, thus preventing the wafer from being scratched in the double-sided polishing process.

CITATION LIST

Patent Literature

PTL 1: Specification of JP 5648623 B2
PTL 2: JP 2002-254299 A
PTL 3: JP 2017-104958 A

SUMMARY

Technical Problem

In the case where double-sided polishing treatment is performed on a carrier plate unused after manufacture by the method described in PTL 3, the polishing rate is 1/10 or less as compared with the case of polishing a silicon wafer, and it takes an enormous amount of time to polish the carrier plate to a thickness usable for wafer double-sided polishing.

It could therefore be helpful to provide a method capable of efficiently polishing the front and back sides of a carrier plate unused after manufacture, which is used in a double-sided polishing apparatus for semiconductor wafers.

Solution to Problem

We thus provide:

[1] A method of polishing a carrier plate included in a double-sided polishing apparatus that includes: the carrier plate having a wafer holding hole for holding a semiconductor wafer; and an upper surface plate and a lower surface plate facing each other with the carrier plate sandwiched therebetween and each provided with a polishing pad on a surface thereof and that supplies a polishing liquid while relatively rotating the carrier plate, the upper surface plate, and the lower surface plate to perform chemical mechanical polishing simultaneously on front and back sides of the semiconductor wafer held in the wafer holding hole, the method comprising: sandwiching a carrier plate unused after manufacture and to be polished between the upper surface plate and the lower surface plate in the double-sided polishing apparatus, and supplying a polishing liquid while relatively rotating the carrier plate to be polished, the upper surface plate, and the lower surface plate to polish both sides of the carrier plate to be polished, wherein a polishing pad including, on a surface thereof, an abrasive grain-containing layer in which abrasive grains of 2 μm or more in grain size are embedded is used as the polishing pad in the double-sided polishing apparatus.

[2] The method of polishing a carrier plate according to [1], wherein a material of the abrasive grains is alumina or diamond.

[3] The method of polishing a carrier plate according to [1] or [2], wherein the polishing liquid is slurry, water, or an aqueous solution containing a surfactant.

[4] The method of polishing a carrier plate according to any one of [1] to [3], wherein the polishing pad further includes an abrasive grain-free layer in which the abrasive grains are not embedded, directly below the abrasive grain-containing layer.

[5] A carrier plate having a flatness of 2 μm or less.

[6] A method of polishing a semiconductor wafer, the method comprising placing a semiconductor wafer to be polished in a wafer holding hole of the carrier plate polished by the method of polishing a carrier plate according to any one of [1] to [4] or the carrier plate according to [5], sandwiching the carrier plate between an upper surface plate and a lower surface plate of a double-sided polishing apparatus, and supplying a polishing liquid while relatively rotating the carrier plate, the upper surface plate, and the lower surface plate to polish front and back sides of the semiconductor wafer to be polished.

[7] The method of polishing a semiconductor wafer according to [6], wherein the semiconductor wafer is a silicon wafer.

Advantageous Effect

It is thus possible to efficiently polish the front and back sides of a carrier plate unused after manufacture, which is used in a double-sided polishing apparatus for semiconductor wafers.

Figures 1A, 1B:
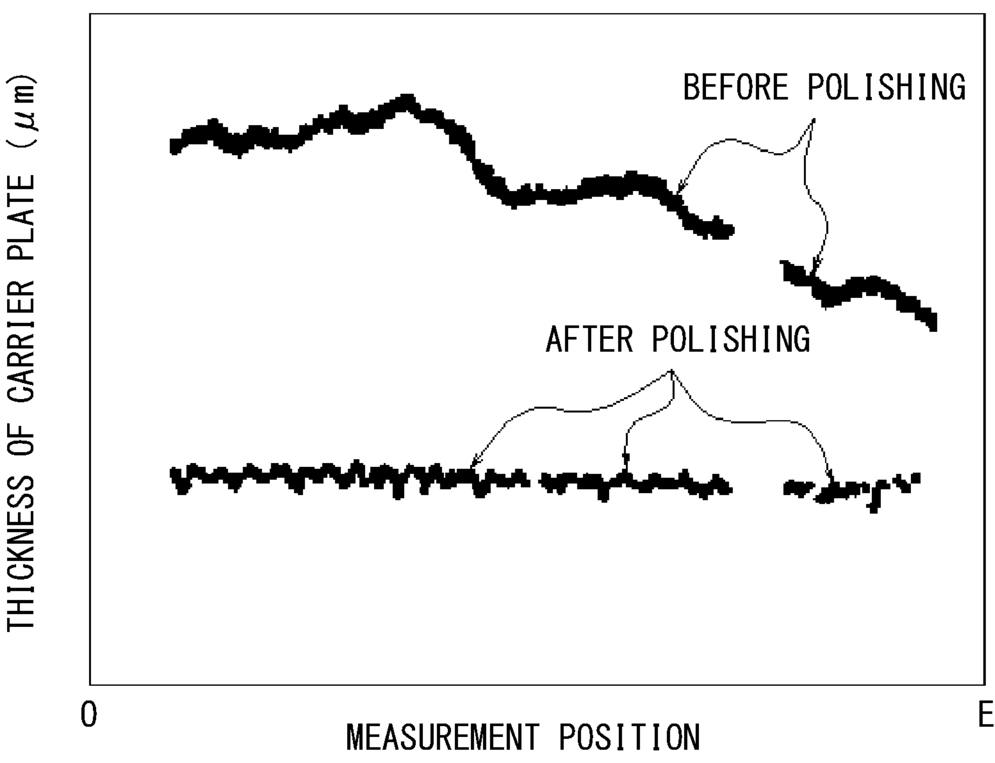
FIG. 1A is a diagram for explaining the relationship between the position and the thickness in a carrier plate after polishing in Example 6, and illustrates a measurement location.
FIG. 1B is a diagram for explaining the relationship between the position and the thickness in the carrier plate after polishing in Example 6, and illustrates the thickness of the carrier plate at each measurement position.

DETAILED DESCRIPTION (Method of Polishing Carrier Plate)

An embodiment of the present disclosure will be described below, with reference to the drawings. A method of polishing a carrier plate according to the present disclosure is a method of polishing a carrier plate included in a double-sided polishing apparatus that includes: the carrier plate having a wafer holding hole for holding a semiconductor wafer; and an upper surface plate and a lower surface plate facing each other with the carrier plate sandwiched therebetween and each provided with a polishing pad on a surface thereof and that supplies a polishing liquid while relatively rotating the carrier plate, the upper surface plate, and the lower surface plate to perform chemical mechanical polishing simultaneously on front and back sides of the silicon wafer held in the wafer holding hole. The method comprises: sandwiching a carrier plate unused after manufacture and to be polished between the upper surface plate and the lower surface plate in the double-sided polishing apparatus, and supplying a polishing liquid while relatively rotating the carrier plate to be polished, the upper surface plate, and the lower surface plate to polish both sides of the carrier plate to be polished, wherein a polishing pad including, on a surface thereof, an abrasive grain-containing layer in which abrasive grains of 2 μm or more in grain size are embedded is used as the polishing pad in the double-sided polishing apparatus.

As mentioned above, a carrier plate in a double-sided polishing apparatus is, in a stage of being unused after manufacture, polished to a thickness that enables double-sided polishing of a semiconductor wafer. We used the method described in PTL 3 to polish a carrier plate, and found out that the polishing requires an enormous amount of time.

We then carefully examined ways to polish carrier plates more efficiently, and conceived the idea of, when polishing a carrier plate unused after manufacture and to be polished by use of a double-sided polishing apparatus, using, as the polishing pad attached to each of the upper surface plate and the lower surface plate, a polishing pad having a fixed abrasive grain layer in which fixed abrasive grains are embedded on its surface.

However, it was revealed that simply using a polishing pad having a fixed abrasive grain layer on its surface to polish a carrier plate does not necessarily increase the polishing rate, as seen in the below-described examples. In view of this, we conducted further study, and discovered that the polishing rate increases as a result of the grain size of the fixed abrasive grains being 2 μm or more. The present disclosure is based on this discovery. Each requirement will be described below.

First, a carrier plate to be polished is a carrier plate unused after manufacture, and has at least one holding hole for holding a semiconductor wafer in a double-sided polishing apparatus. The number of holding holes may be any appropriate number greater than or equal to 1.

The carrier plate to be polished may include a metal portion having at least one holding hole for holding a semiconductor wafer and an annular resin portion located along the inner wall defining the holding hole, or may be entirely composed of a resin portion. The metal portion may be made of metal such as stainless steel (Steel Special Use Stainless, SUS) or titanium. The resin portion may be made of resin such as epoxy, phenol, or polyimide, or fiber-reinforced plastic in which reinforcing fiber such as glass fiber, carbon fiber, or aramid fiber is contained in resin.

The semiconductor wafer to be held in the holding hole of the carrier plate and polished may be made of silicon, germanium, gallium arsenide, or the like. The diameter of the semiconductor wafer is not limited, and may be 150 mm or more. For example, the diameter of the semiconductor wafer may be 150 mm, 200 mm, 300 mm, or 450 mm. The semiconductor wafer may be of N-type or P-type as a result of addition of an appropriate dopant.

In the present disclosure, the carrier plate to be polished is polished using a double-sided polishing apparatus. Here, it is important that the polishing pads attached to the upper surface plate and the lower surface plate of the double-sided polishing apparatus each include an abrasive grain-containing layer in which abrasive grains of 2 μm or more in grain size are embedded. If the grain size of the abrasive grains is less than 2 μm, the ability to polish the surface of the carrier plate is low and polishing cannot be performed efficiently, as seen in the below-described examples. The grain size of the abrasive grains is therefore 2 μm or more. The grain size of the abrasive grains is preferably 3 μm or more. Thus, the polishing rate can be increased significantly.

No upper limit is placed on the grain size of the abrasive grains in terms of the efficiency of polishing the carrier plate. However, if the grain size of the abrasive grains is more than 20 μm, there is a possibility that the surface of the carrier plate is scratched or an edge portion of the carrier plate is greatly damaged, and as a result many scratches occur on the semiconductor wafer to be polished. Accordingly, the grain size of the abrasive grains is preferably 20 μm or less.

In the present disclosure, the grain size of abrasive grains is measured by the laser diffraction scattering method (JIS Z 8825).

The matrix forming the base of the abrasive grain-containing layer in which the abrasive grains are embedded can be made of an appropriate material capable of firmly holding the abrasive grains. As such a material, resin, ceramic material, or the like may be used. Examples of the resin include epoxy resin and acrylic resin. Any type of epoxy resin or acrylic resin can hold abrasive grains sufficiently.

The material of the abrasive grains embedded in the fixed abrasive grain layer located on the surface of the polishing pad is not limited as long as it can polish the surface of the carrier plate. Alumina or diamond is preferable in terms of high polishing ability.

The abrasive grains are preferably dispersed uniformly in the fixed abrasive grain layer. This allows continuous polishing of the carrier plate with the same quality.

The thickness of the abrasive grain-containing layer is preferably 0.2 mm or more and 2.5 mm or less. If the thickness of the abrasive grain-containing layer is 0.2 mm or more, the carrier plate can be favorably polished without a decrease in polishing speed. If the thickness of the abrasive grain-containing layer is 2.5 mm or less, the carrier plate can be provided with good flatness.

In the case where the matrix of the abrasive grain-containing layer is made of resin, the resin is preferably non-foamed resin that does not foam. This can enhance the hardness of the carrier plate. The Shore D hardness (JIS K6253) of the abrasive grain-containing layer is preferably 40 or more. Thus, a carrier plate having high flatness can be obtained as a result of polishing, with there being no need to fill the wafer holding hole with a dummy wafer or the like during the polishing.

The polishing pad preferably further includes an abrasive grain-free layer in which abrasive grains are not embedded, directly below the abrasive grain-containing layer. The abrasive grain-free layer functions as a cushioning material and effectively absorbs the vibration of the carrier plate during polishing, with it being possible to enhance the flatness of the carrier plate after the polishing and the flatness of the semiconductor wafer polished using the polished carrier plate.

The abrasive grain-free layer may be formed using resin, ceramic material, or the like. Examples of the resin include epoxy resin and acrylic resin. Any type of epoxy resin or acrylic resin can hold abrasive grains sufficiently.

The thickness of the abrasive grain-free layer is preferably 0.2 mm or more and 2.0 mm or less. If the thickness of the abrasive grain-free layer is 0.2 mm or more, the abrasive grain-free layer has good cushioning property and the carrier plate can be polished favorably. If the thickness of the abrasive grain-free layer is 2.0 mm or less, a good polishing rate can be achieved without reducing the amount of work given to the carrier plate by the abrasive grain-containing layer, while maintaining the cushioning property.

The hardness of the abrasive grain-free layer is preferably less than the hardness of the abrasive grain-containing layer. Thus, the abrasive grain-free layer has good cushioning property and absorbs the vibration of the carrier plate during polishing more effectively, with it being possible to further enhance the flatness of the carrier plate.

The abrasive grain-free layer is preferably integrated with the abrasive grain-containing layer. As a result of the two layers being integrated with each other, the vibration of the carrier plate during polishing can be absorbed more effectively, and the flatness of the carrier plate can be further enhanced. For example, the abrasive grain-free layer and the abrasive grain-containing layer may be heat-fused to be integrated with each other.

The polishing liquid used when polishing the carrier plate may be slurry, water, or an aqueous solution containing a surfactant. Abrasive grains contained in the slurry may be silica, alumina, cerium oxide, or the like.

(Carrier Plate)

A carrier plate according to the present disclosure has a flatness of 2 μm or less.

A carrier plate unused after manufacture and to be polished can be efficiently polished by the method of polishing a carrier plate according to the present disclosure, as described above. The polished carrier plate has a high flatness of 2 μm or less. As a result of placing such a carrier plate according to the present disclosure in a double-sided polishing apparatus and performing double-sided polishing on a semiconductor wafer, a semiconductor wafer having high flatness can be obtained.

In the present disclosure, the flatness of the carrier plate means the difference between the maximum value and the minimum value of the thickness of the carrier plate measured along a straight line that includes the center of the carrier plate and the center of the wafer holding hole from a position of 10 mm from the edge of the wafer holding hole to a position of 30 mm from the outer edge of the carrier plate when the carrier plate is viewed from above.

The carrier plate may include a metal portion having at least one holding hole for holding a semiconductor wafer and an annular resin portion located along the inner wall defining the holding hole, or may be entirely composed of a resin portion. The metal portion may be made of metal such as stainless steel (Steel Special Use Stainless, SUS) or titanium, or such metal coated with diamond-like carbon (DLC). The resin portion may be made of resin such as epoxy, phenol, or polyimide, or made of fiber-reinforced plastic in which reinforcing fiber such as glass fiber, carbon fiber, or aramid fiber is contained in resin.

(Method of Polishing Semiconductor Wafer)

A method of polishing a semiconductor wafer according to the present disclosure comprises placing a semiconductor wafer to be polished in a wafer holding hole of the carrier plate polished by the method of polishing a carrier plate according to the present disclosure or the carrier plate according to the present disclosure, sandwiching the carrier plate between an upper surface plate and a lower surface plate of a double-sided polishing apparatus, and supplying a polishing liquid while relatively rotating the carrier plate, the upper surface plate, and the lower surface plate to polish front and back sides of the semiconductor wafer to be polished.

According to the present disclosure, the carrier plate polished by the method of polishing a carrier plate according to the present disclosure or the carrier plate according to the present disclosure has high flatness. As a result of placing such a carrier plate in a double-sided polishing apparatus and performing double-sided polishing on a semiconductor wafer, a semiconductor wafer having high flatness can be obtained.

Thus, according to the present disclosure, the carrier plate polished by the method of polishing a carrier plate according to the present disclosure or the carrier plate according to the present disclosure is placed in a double-side polishing apparatus to perform double-side polishing on a semiconductor wafer.

The other conditions are not limited, and may be appropriately selected from conventionally known methods.

The semiconductor wafer to be polished is not limited, but silicon wafers can be polished particularly favorably.

EXAMPLES

The presently disclosed techniques will be described below by way of examples, although the present disclosure is not limited to such examples.

Conventional Example 1

A carrier plate to be polished was subjected to polishing treatment using a double-sided polishing apparatus. As the carrier plate to be polished, a carrier plate having a diameter of 500 mm and a holding hole diameter of 300 mm as illustrated in FIG. 1A, made of glass epoxy resin, and unused after manufacture was prepared. The carrier plate was sandwiched between the upper surface plate and the lower surface plate in the double-sided polishing apparatus, and the carrier plate, the upper surface plate, and the lower surface plate were relatively rotated to simultaneously polish the front and back sides of the carrier plate. Abrasive grain-free urethane polishing pads manufactured by NITTA DuPont Inc. were used in the upper surface plate and the lower surface plate, and slurry containing silica of 100 nm in grain size was used as the polishing liquid. The polishing conditions and the polishing rate when polishing the carrier plate are shown in Table 1.

TABLE 1

| | Abrasive grains in polishing pad | Abrasive grains in polishing liquid | Abrasive grain size (μm) | Polishing rate (relative value) |
|---|---|---|---|---|
| Conventional Example 1 | — | Silica | 0.1 | 1.00 |
| Conventional Example 2 | — | Silica | 0.3 | 1.43 |
| Conventional Example 3 | Silica | Silica | 0.3 | 1.43 |
| Conventional Example 4 | — | Alumina | 3 | 1.86 |
| Example 1 | Alumina | — | 2 | 2.01 |
| Example 2 | Alumina | — | 3 | 42.86 |
| Example 3 | Alumina | Alumina | 3 | 44.29 |
| Example 4 | Diamond | — | 2 | 2.14 |
| Example 5 | Diamond | — | 3 | 10.14 |
| Example 6 | Diamond | — | 6 | 44.29 |
| Example 7 | Diamond | — | 9 | 85.71 |

Conventional Example 2

A carrier plate to be polished was subjected to polishing treatment in the same way as Conventional Example 1. Here, slurry containing silica of 300 nm in grain size was used as the polishing liquid. The other conditions are all the same as in Conventional Example 1. The polishing conditions and the polishing rate when polishing the carrier plate are shown in Table 1. The polishing rate is expressed as a value relative to the polishing rate in Conventional Example 1.

Conventional Example 3

A carrier plate to be polished was subjected to polishing treatment in the same way as Conventional Example 1. Here, slurry containing silica of 300 nm in grain size was used as the polishing liquid. An abrasive grain-containing layer obtained by containing, in acrylic resin, silica of 300 nm in grain size was used in the polishing pad. The other conditions are all the same as in Conventional Example 1. The polishing conditions and the polishing rate when polishing the carrier plate are shown in Table 1. The polishing rate is expressed as a value relative to the polishing rate in Conventional Example 1.

Conventional Example 4

A carrier plate to be polished was subjected to polishing treatment in the same way as Conventional Example 1. Here, slurry containing alumina of 3 μm in grain size was used as the polishing liquid. The other conditions are all the same as in Conventional Example 1. The polishing conditions and the polishing rate when polishing the carrier plate are shown in Table 1. The polishing rate is expressed as a value relative to the polishing rate in Conventional Example 1.

Example 1

A carrier plate to be polished was subjected to polishing treatment in the same way as Conventional Example 1. Pure water was used as the polishing liquid. An abrasive grain-containing layer obtained by containing, in acrylic resin, alumina of 2 μm in grain size was used in the polishing pad. The other conditions are all the same as in Conventional Example 1. The polishing conditions and the polishing rate when polishing the carrier plate are shown in Table 1. The polishing rate is expressed as a value relative to the polishing rate in Conventional Example 1.

Example 2

A carrier plate to be polished was subjected to polishing treatment in the same way as Example 1. Here, the grain size of alumina in the polishing pad was 3 μm. The other conditions are all the same as in Example 1. The polishing conditions and the polishing rate when polishing the carrier plate are shown in Table 1. The polishing rate is expressed as a value relative to the polishing rate in Conventional Example 1.

Example 3

A carrier plate to be polished was subjected to polishing treatment in the same way as Example 2. Here, slurry containing alumina of 3 μm in grain size was used as the polishing liquid. The other conditions are all the same as in Example 2. The polishing conditions and the polishing rate when polishing the carrier plate are shown in Table 1. The polishing rate is expressed as a value relative to the polishing rate in Conventional Example 1.

Example 4

A carrier plate to be polished was subjected to polishing treatment in the same way as Example 1. Here, diamond was used as abrasive grains contained in the abrasive grain-containing layer of the polishing pad. The other conditions are all the same as in Example 1. The polishing conditions and the polishing rate when polishing the carrier plate are shown in Table 1. The polishing rate is expressed as a value relative to the polishing rate in Conventional Example 1.

Example 5

A carrier plate to be polished was subjected to polishing treatment in the same way as Example 2. Here, diamond was used as abrasive grains contained in the abrasive grain-containing layer of the polishing pad. The other conditions are all the same as in Example 2. The polishing conditions and the polishing rate when polishing the carrier plate are shown in Table 1. The polishing rate is expressed as a value relative to the polishing rate in Conventional Example 1.

Example 6

A carrier plate to be polished was subjected to polishing treatment in the same way as Example 5. Here, the grain size of diamond contained in the abrasive grain-containing layer of the polishing pad was 6 μm. The other conditions are all the same as in Example 5. The polishing conditions and the polishing rate when polishing the carrier plate are shown in Table 1. The polishing rate is expressed as a value relative to the polishing rate in Conventional Example 1.

Example 7

A carrier plate to be polished was subjected to polishing treatment in the same way as Example 5. Here, the grain size of diamond contained in the abrasive grain-containing layer of the polishing pad was 9 μm. The other conditions are all the same as in Example 5. The polishing conditions and the polishing rate when polishing the carrier plate are shown in Table 1. The polishing rate is expressed as a value relative to the polishing rate in Conventional Example 1.

<Relationship Between Grain Size of Abrasive Grains and Polishing Rate>

As can be understood from Table 1, in Examples 1 to 7 in which the polishing pad had an abrasive grain-containing layer having abrasive grains embedded therein and the grain size of the abrasive grains was 2 μm or more, the polishing rate was twice or more the polishing rate in Conventional Example 1 in which a polishing liquid containing silica was used for polishing. In particular, in Examples 2, 3, and 5 to 7 in which the grain size of the abrasive grains was 3 μm or more, the polishing rate was 10 times or more that in Conventional Example 1. In the case where the abrasive grains were made of alumina, the polishing rate was 40 times or more that in Conventional Example 1. Thus, the polishing rate increased greatly. As can be seen from the comparison of Examples 5 to 7, the polishing rate was higher when the grain size of the abrasive grains was larger.

FIGS. 1A and 1B illustrate the relationship between the position and the thickness in the carrier plate after polishing, that is, the shape of the carrier plate, for Example 6. FIG. 1A illustrates the measurement location, and FIG. 1B illustrates the thickness of the carrier plate at each measurement position. In FIG. 1B, the parts without thickness data are those in which the thickness could not be measured due to openings (not illustrated) in the carrier plate other than the wafer holding hole. As illustrated in FIG. 1B, while the thickness of the carrier plate varied depending on the measurement position before polishing, the thickness of the carrier plate was uniform after polishing, that is, the flatness was improved as a result of polishing.

Comparative Example 1

A carrier plate was polished in the same way as in Conventional Example 1. Here, a grinding apparatus was used as the polishing apparatus. The other conditions are all the same as in Conventional Example 1. The polishing conditions and the flatness of the carrier plate are shown in Table 2.

TABLE 2

| | Polishing conditions | Thickness of abrasive grain-free layer (mm) | Evaluation number | Average flatness of carrier plate (μm) |
|---|---|---|---|---|
| Comparative Example 1 | LAP processing | — | 10 | 4.2 |
| Conventional Example 1 | Polishing pad (no fixed containing layer) + slurry | — | 10 | 2.5 |
| Example 6 | Polishing pad (with fixed containing layer, abrasive grain size: 6 μm) | — | 5 | 3.8 |
| Example 8 | Polishing pad (with fixed containing layer, abrasive grain size: 6 μm) | 0.3 | 5 | 1.6 |
| Example 9 | Polishing pad (with fixed containing layer, abrasive grain size: 6 μm) | 0.6 | 5 | 1.8 |
| Example 10 | Polishing pad (with fixed containing layer, abrasive grain size: 6 μm) | 1 | 5 | 1.7 |

Example 8

A carrier plate to be polished was subjected to polishing treatment in the same way as Example 6. Here, an abrasive grain-free layer (made of urethane resin, thickness: 0.3 mm) was located directly below the abrasive grain-containing layer of the polishing pad. The other conditions are all the same as in Example 6. The polishing conditions and the flatness of the carrier plate are shown in Table 2.

Example 9

A carrier plate to be polished was subjected to polishing treatment in the same way as Example 8. Here, the thickness of the abrasive grain-free layer was 0.6 mm. The other conditions are all the same as in Example 8. The polishing conditions and the flatness of the carrier plate are shown in Table 2.

Example 10

A carrier plate to be polished was subjected to polishing treatment in the same way as Example 8. Here, the thickness of the abrasive grain-free layer was 1.0 mm. The other conditions are all the same as in Example 8. The polishing conditions and the flatness of the carrier plate are shown in Table 2.

<Flatness of Carrier Plate>

As can be understood from Table 2, in Example 6 having no abrasive grain-free layer in the polishing pad, the flatness of the carrier plate after polishing was similar to that in Comparative Example 1 and Conventional Example 1. On the other hand, in Examples 8 to 10 having an abrasive grain-free layer in the polishing pad, the flatness of the carrier plate after polishing was very high.

Figure 2:
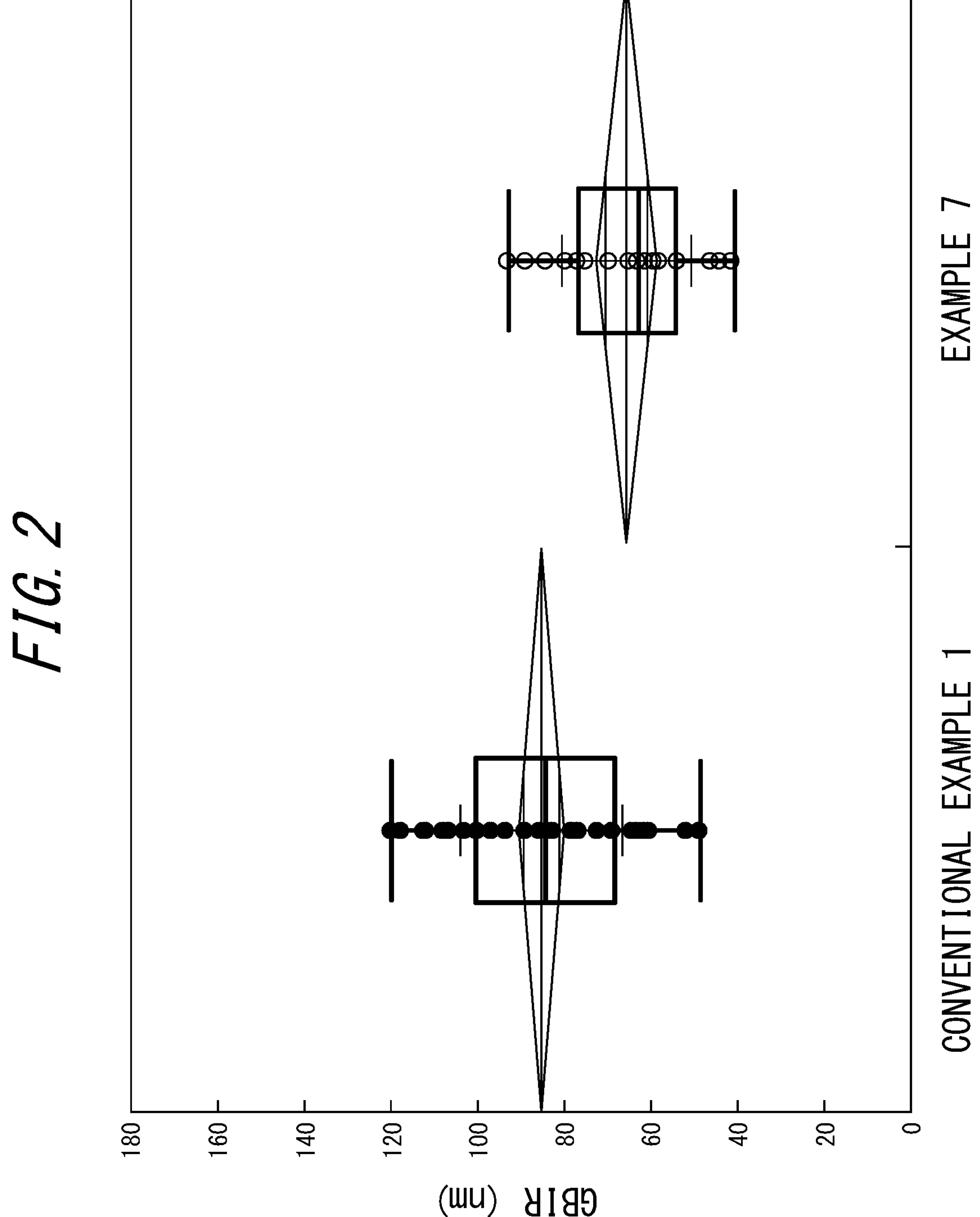
FIG. 2 is a diagram illustrating the GBIR of each of silicon wafers subjected to double-sided polishing treatment using carrier plates subjected to polishing treatment according to Conventional Example and Example.

FIG. 2 illustrates the GBIR (Global Flatness Back Ideal Range) of each silicon wafer after the respective carrier plates of Conventional Example 1 and Example 7 were each placed in a double-sided polishing apparatus and 25 silicon wafers of 300 mm in diameter were double-sided polished. As illustrated in FIG. 2, the silicon wafers double-sided polished using the carrier plate polished according to the presently disclosed techniques had higher flatness than those double-sided polished using the conventional carrier plate.

INDUSTRIAL APPLICABILITY

It is thus possible to efficiently polish the front and back sides of a carrier plate unused after manufacture, which is used in a double-sided polishing apparatus for semiconductor wafers. Such techniques are useful in the semiconductor wafer manufacturing industry.

The invention claimed is:

1. A method of polishing a carrier plate included in a double-sided polishing apparatus that includes: the carrier plate having a wafer holding hole for holding a semiconductor wafer; and an upper surface plate and a lower surface plate facing each other with the carrier plate sandwiched therebetween and each provided with a polishing pad on a surface thereof and that supplies a polishing liquid while relatively rotating the carrier plate, the upper surface plate, and the lower surface plate to perform chemical mechanical polishing simultaneously on front and back sides of the semiconductor wafer held in the wafer holding hole, the method comprising:

sandwiching a carrier plate unused after manufacture and to be polished between the upper surface plate and the lower surface plate in the double-sided polishing apparatus for performing chemical mechanical polishing simultaneously on the front and back sides of the semiconductor wafer, and supplying a polishing liquid while relatively rotating the carrier plate to be polished, the upper surface plate, and the lower surface plate to polish both sides of the carrier plate to be polished, wherein a polishing pad including, on a surface thereof, an abrasive grain-containing layer in which abrasive grains of 2 μm or more in grain size are embedded is used as the polishing pad in the double-sided polishing apparatus.

2. The method of polishing a carrier plate according to claim 1, wherein a material of the abrasive grains is alumina or diamond.

3. The method of polishing a carrier plate according to claim 2, wherein the polishing liquid is slurry, water, or an aqueous solution containing a surfactant.

4. The method of polishing a carrier plate according to claim 3, wherein the polishing pad further includes an abrasive grain-free layer in which the abrasive grains are not embedded, directly below the abrasive grain-containing layer.

5. The method of polishing a carrier plate according to claim 2, wherein the polishing pad further includes an abrasive grain-free layer in which the abrasive grains are not embedded, directly below the abrasive grain-containing layer.

6. The method of polishing a carrier plate according to claim 1, wherein the polishing liquid is slurry, water, or an aqueous solution containing a surfactant.

7. The method of polishing a carrier plate according to claim 6, wherein the polishing pad further includes an abrasive grain-free layer in which the abrasive grains are not embedded, directly below the abrasive grain-containing layer.

8. The method of polishing a carrier plate according to claim 1, wherein the polishing pad further includes an abrasive grain-free layer in which the abrasive grains are not embedded, directly below the abrasive grain-containing layer.

9. The method of polishing a carrier plate according to claim 8, wherein the abrasive grain-free layer has a thickness of 0.2 mm or more and 2.0 mm or less.

10. A method of polishing a semiconductor wafer, the method comprising placing a semiconductor wafer to be polished in a wafer holding hole of the carrier plate polished by the method of polishing a carrier plate according to claim 1, sandwiching the carrier plate between an upper surface plate and a lower surface plate of a double-sided polishing apparatus, and supplying a polishing liquid while relatively rotating the carrier plate, the upper surface plate, and the lower surface plate to polish front and back sides of the semiconductor wafer to be polished.

11. The method of polishing a semiconductor wafer according to claim 10, wherein the semiconductor wafer is a silicon wafer.

12. A method of polishing a semiconductor wafer, the method comprising placing a semiconductor wafer to be polished in a wafer holding hole of the carrier plate polished by the method of polishing a carrier plate according to claim 2, sandwiching the carrier plate between an upper surface plate and a lower surface plate of a double-sided polishing apparatus, and supplying a polishing liquid while relatively rotating the carrier plate, the upper surface plate, and the lower surface plate to polish front and back sides of the semiconductor wafer to be polished.

13. A method of polishing a semiconductor wafer, the method comprising placing a semiconductor wafer to be polished in a wafer holding hole of the carrier plate polished by the method of polishing a carrier plate according to claim 6, sandwiching the carrier plate between an upper surface plate and a lower surface plate of a double-sided polishing apparatus, and supplying a polishing liquid while relatively rotating the carrier plate, the upper surface plate, and the lower surface plate to polish front and back sides of the semiconductor wafer to be polished.

14. A method of polishing a semiconductor wafer, the method comprising placing a semiconductor wafer to be polished in a wafer holding hole of the carrier plate polished by the method of polishing a carrier plate according to claim 8, sandwiching the carrier plate between an upper surface plate and a lower surface plate of a double-sided polishing apparatus, and supplying a polishing liquid while relatively rotating the carrier plate, the upper surface plate, and the lower surface plate to polish front and back sides of the semiconductor wafer to be polished.

15. A method of polishing a semiconductor wafer, the method comprising placing a semiconductor wafer to be polished in a wafer holding hole of the carrier plate polished by the method of polishing a carrier plate according to claim 3, sandwiching the carrier plate between an upper surface plate and a lower surface plate of a double-sided polishing apparatus, and supplying a polishing liquid while relatively rotating the carrier plate, the upper surface plate, and the lower surface plate to polish front and back sides of the semiconductor wafer to be polished.

16. A method of polishing a semiconductor wafer, the method comprising placing a semiconductor wafer to be polished in a wafer holding hole of the carrier plate polished by the method of polishing a carrier plate according to claim 5, sandwiching the carrier plate between an upper surface plate and a lower surface plate of a double-sided polishing apparatus, and supplying a polishing liquid while relatively rotating the carrier plate, the upper surface plate, and the lower surface plate to polish front and back sides of the semiconductor wafer to be polished.

17. A method of polishing a semiconductor wafer, the method comprising placing a semiconductor wafer to be polished in a wafer holding hole of the carrier plate polished by the method of polishing a carrier plate according to claim 7, sandwiching the carrier plate between an upper surface plate and a lower surface plate of a double-sided polishing apparatus, and supplying a polishing liquid while relatively rotating the carrier plate, the upper surface plate, and the lower surface plate to polish front and back sides of the semiconductor wafer to be polished.

18. A method of polishing a semiconductor wafer, the method comprising placing a semiconductor wafer to be polished in a wafer holding hole of the carrier plate polished by the method of polishing a carrier plate according to claim 4, sandwiching the carrier plate between an upper surface plate and a lower surface plate of a double-sided polishing apparatus, and supplying a polishing liquid while relatively rotating the carrier plate, the upper surface plate, and the lower surface plate to polish front and back sides of the semiconductor wafer to be polished.

* * * * *